(12) United States Patent
Inoue

(10) Patent No.: US 6,689,625 B2
(45) Date of Patent: Feb. 10, 2004

(54) METHOD FOR CORRECTING A DESIGN DATA OF A LAYOUT PATTERN OF A PHOTOMASK, PHOTOMASK MANUFACTURED BY SAID METHOD, AND SEMICONDUCTOR DEVICE METHOD USING SAID PHOTOMASK

(75) Inventor: Mari Inoue, Yokohama (JP)

(73) Assignees: Kabushiki Kaisha Toshiba, Tokyo (JP); Dai Nippon Printing Co., LTD, Tokyo (JP)

( * ) Notice: Subject to any disclaimer, the term of this patent is extended or adjusted under 35 U.S.C. 154(b) by 0 days.

(21) Appl. No.: 10/107,247

(22) Filed: Mar. 28, 2002

(65) Prior Publication Data

US 2002/0142233 A1 Oct. 3, 2002

(30) Foreign Application Priority Data

Mar. 29, 2001 (JP) ........................................ 2001-095971

(51) Int. Cl.⁷ ..................... G01K 31/26; H01L 21/66; H01L 21/00
(52) U.S. Cl. ..................... 438/14; 438/942; 438/800
(58) Field of Search .................. 438/942, 944, 438/948–951, 14, 16, 401, 462

(56) References Cited

U.S. PATENT DOCUMENTS 4,499,595 A * 2/1985 Masaitis et al. ............ 382/177

FOREIGN PATENT DOCUMENTS

| JP | 7-297252 | 11/1995 |
|----|----------|---------|
| JP | 2000-20564 | 1/2000 |
| JP | 2000-75467 | 3/2000 |

OTHER PUBLICATIONS

Int'l Sematech "Advanced Process Control Framework Intitiative Project Overview" Jun. 30, 1999 Technology Transfer No. 99053735A–TR <http://www.sematech.org/public/docubase/document/3735atr.pdf> visitied Apr. 4, 2003.*

Kotani et al., "Highly Accurate Process Proximity Correction Based on Empirical model for 0.18 &82 m Generation and Beyond", Jpn. J. Appl. Phys. vol. 38 (1999), pp. 6957–6962, Part 1, No. 12B, Dec. 1999.

Takahashi et al., "Performance of JBX–9000MV with Negative Tone Resist for 130 nm Reticle", 20$^{th}$ Annual BACUS Symposium on Photomask Technology, vol. 4186, pp. 22–33, XP008020520, Proceedings of SPIE vol. 4186 (2001).

* cited by examiner

Primary Examiner—Craig Thompson
(74) Attorney, Agent, or Firm—Finnegan, Henderson, Farabow, Garrett & Dunner, L.L.P.

(57) ABSTRACT

Disclosed is a method of manufacturing a photomask, comprising calculating a pattern area ratio, which is a ratio of the light transmitting pattern portion or the light shielding pattern portion to an area of the photomask from the design data of a given layout pattern of the photomask, and a pattern density, which is a ratio of the light transmitting pattern portion or light shielding pattern portion within the region to the area of the region extracted from the given layout pattern, estimating from the calculated pattern area ratio and the pattern density the size of a pattern formed in the case where the pattern is formed on the photomask by using the design data of the given layout pattern, and imparting the amount of correction to the design data of the given layout pattern based on the estimated pattern size.

5 Claims, 7 Drawing Sheets

METHOD FOR CORRECTING A DESIGN DATA OF A LAYOUT PATTERN OF A PHOTOMASK, PHOTOMASK MANUFACTURED BY SAID METHOD, AND SEMICONDUCTOR DEVICE METHOD USING SAID PHOTOMASK

CROSS-REFERENCE TO RELATED APPLICATIONS

This application is based upon and claims the benefit of priority from the prior Japanese Patent Application No. 2001-095971, filed Mar. 29, 2001, the entire contents of which are incorporated herein by reference.

BACKGROUND OF THE INVENTION

1. Field of the Invention

The present invention relates to a method of manufacturing a photomask for correcting the design data of the layout pattern of a photomask for transferring a predetermined optical image pattern onto a substrate, a photomask manufactured by using the layout pattern corrected by the correcting method, and a method for manufacturing a semiconductor device using the photomask thus manufactured.

2. Description of the Related Art

With progress in the miniaturization of the circuit pattern of a semiconductor device, the miniaturization also proceeds in the pattern size of the photomask providing the original plate of the circuit pattern. In this connection, the demands for accuracy are becoming strict and strict. In recent years, various corrections such as the OPC (Optical Proximity Correction) have come to be applied to the design pattern in the device process in order to achieve an accuracy of several nanometers. Naturally, the accuracy of the photomask is a very important factor in the device process.

In the manufacturing process for a semiconductor device or a photomask, it is generally known to the art that the process size is changed depending on the pattern aperture rate or the pattern density by the micro loading effect in the step of the developing process or the dry etching process. In general, the size of the pattern on the photomask is several times as large as the size of the image transferred onto the wafer, with the result that the pattern aperture rate of the photomask greatly differs depending on the layer, which to increases the variations in size generated by the difference in the aperture rate. It should also be noted that, in devices having a large variation in density, such as a memory-mixed logic device, the difference in density of the patterns among the different regions on the photomask is increased by the diversification of the devices. As a result, the change in size caused by the micro loading effect has obstructed the improvements in the dimensional accuracy and positional accuracy corresponding to the demands for the miniaturization.

The conventional method for manufacturing a photomask for controlling the change in size caused by the pattern aperture rate and the pattern density will now be described.

The layout data for photomask writing system is basically equal to the initial design data, and the pattern size drawn by photomask writing system is equal to the desired pattern size. It should be noted, however, that, where the finish size is shifted from the design data because of, for example, the decrease in the shot connection in EB (electron beam) exposure system using VSB (variable shaped beam) method and the improvements in the pattern image quality and the dimensional accuracy, a predetermined photomask data bias (resize) is given to the layout data for photomask writing system relative to the design data. In any case, photomask data bias is uniform relative to a certain process regardless of the pattern aperture rate.

However, since there is a large difference in the etching area between, for example, a pattern involving a contact hole and a pattern for a wiring such as a gate electrode, the etching rates for these patterns differ from each other, which gives rise to a difference in the pattern shape and to a difference of scores of nanometers in the final size. For overcoming this difficulty, it was customary in the past to roughly classify the patterns mainly into contact holes group and a wiring group and to prepare a photomask by controlling the process conditions such as the dose, the developing time and the etching time according to on the kind of pattern, so as to control the process size.

If the finish size, the positional accuracy and the XY difference of the processed photomask fail to satisfy the standards, the photomask is discarded as a defective photomask, and a new photomask is remade again by controlling and changing the process conditions. In this fashion, similar steps are repeated until a photomask satisfying the desired standards is obtained.

However, even in the same wiring group pattern, the aperture rate differs if the patterns differ from each other in the line width and the chip area. Also, if the difference in the pattern density differs, a change in the process size also takes place similarly. In some cases, the difference in size between the patterns is increased to reach scores of nanometers. The change in the process size also affects the positional accuracy and the accuracy in the XY difference. It is difficult to control such a large difference in size by adjusting the process conditions alone, and it is necessary to repeat the preparation many times by adjusting the process conditions. Depending on the process conditions, the process margin was lowered, which brought about drawbacks such as an increase in defects.

Particularly, when it comes to a pattern having a large difference in density such as a logic device, a change in the size is large so as to makes it difficult to control the process conditions. In this case, the first lot for the new pattern is rendered defective in many cases, which gives rise to the problem that the yield is lowered.

BRIEF SUMMARY OF THE INVENTION

According to a first aspect of the present invention, there is provided a method of manufacturing a photomask for correcting a layout pattern of a photomask in which are arranged a light transmitting pattern portion and a light shielding pattern portion for forming an optical image pattern on the surface of a substrate, comprising calculating a pattern area ratio, which is a ratio of the light transmitting pattern portion or the light shielding pattern portion to an area of the photomask from the design data of a given layout pattern of the photomask, and a pattern density, which is a ratio of the light transmitting pattern portion or light shielding pattern portion within the region to the area of the region extracted from the given layout pattern; estimating from the calculated pattern area ratio and the pattern density the size of a pattern, positional accuracy or the XY difference, covering the case where the pattern is formed on the photomask by using the design data of the given layout pattern; and imparting the amount of correction to the design data of the given layout pattern based on the estimated pattern size, positional accuracy or the XY difference.

According to a second aspect of the present invention, there is provided a method of manufacturing a photomask for correcting the layout pattern of a photomask in which a light transmitting pattern portion and a light shielding pattern portion are formed for forming a predetermined optical image pattern on the surface of a substrate, comprising, calculating a pattern area ratio, which is a ratio of the area of the light transmitting pattern portion or the light shielding pattern portion to the area of a photomask, and a pattern density, which is a ratio of the area of the light transmitting pattern portion or the light shielding pattern portion within the region to the area of the region extracted from the given layout pattern based on given design data of the layout pattern of the photomask; estimating the positional accuracy of the formed pattern from the calculated pattern area ratio and the pattern density, covering the case where a pattern is formed in the photomask by using given design data of the layout pattern; and imparting a correction amount to the given layout pattern based on the estimated positional accuracy.

Further, according to a third aspect of the present invention, there is provided a method of manufacturing a photomask for correcting the layout pattern of the photomask in which a light transmitting pattern portion and a light shielding pattern portion are arranged for forming a predetermined optical image pattern on the surface of a substrate, comprising calculating a pattern area ratio, which is a ratio of the area of the light transmitting pattern portion or the light shielding pattern portion to the area of the photomask, from the design data of a given layout pattern of the photomask, and a pattern density, which is a ratio of the area of the light transmitting pattern portion or the light shielding pattern portion within the region to the area of the region extracted from the given layout pattern; estimating the XY difference of the formed pattern from the calculated pattern area ratio and the pattern density, covering the case where a pattern is formed on the photomask by using the design data of the imparted layout pattern; and imparting a correction amount to the imparted layout pattern based on the estimated XY difference.

DETAILED DESCRIPTION OF THE INVENTION

The embodiments of the present invention will now be described with reference to the accompanying drawings.

[First Embodiment]

The first embodiment is directed to a method of manufacturing a photomask pattern for a memory device represented by DRAM, in which the pattern density is almost uniform.

Figure 1:
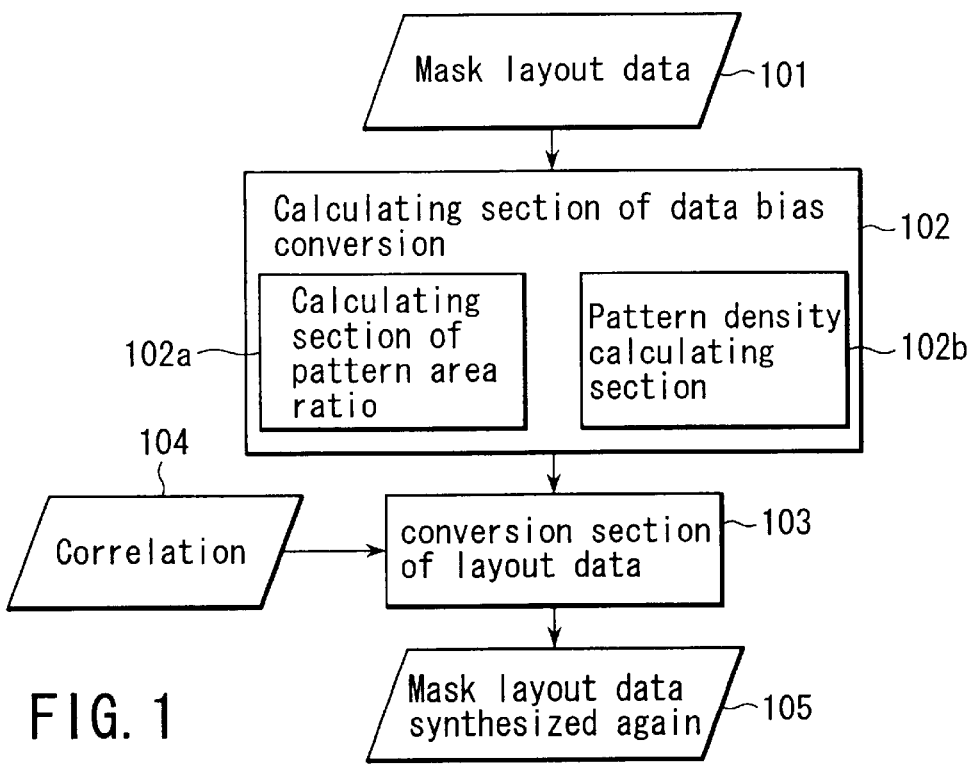
FIG. 1 is a block diagram schematically showing the construction of an apparatus for converting the photomask layout pattern data according to a first embodiment of the present invention.

FIG. 1 is a block diagram schematically showing the construction of an apparatus for converting the photomask layout pattern. In FIG. 1, a reference numeral 101 denotes photomask layout data that is to be corrected, a reference numeral 102 denotes a data bias conversion parameter calculating section for calculating the parameter required for the conversion from the photomask layout data 101 into new data, a reference numeral 102a denotes a pattern area ratio calculating section, a reference numeral 102b denotes a pattern density calculating section, and a reference numeral 103 denotes a layout data conversion section for correcting the photomask layout data 101 by using the parameter calculated in the data bias conversion parameter calculating section 102 and a correlation 104 referred to herein later and outputting converted photomask layout data 105.

Incidentally, it is possible to utilize hardware for realizing each of the functions described herein later of the data bias conversion parameter calculating section 102 and the layout data conversion section 103. It is also possible to describe each function by a program and to execute the program by using a computer.

Figure 2:
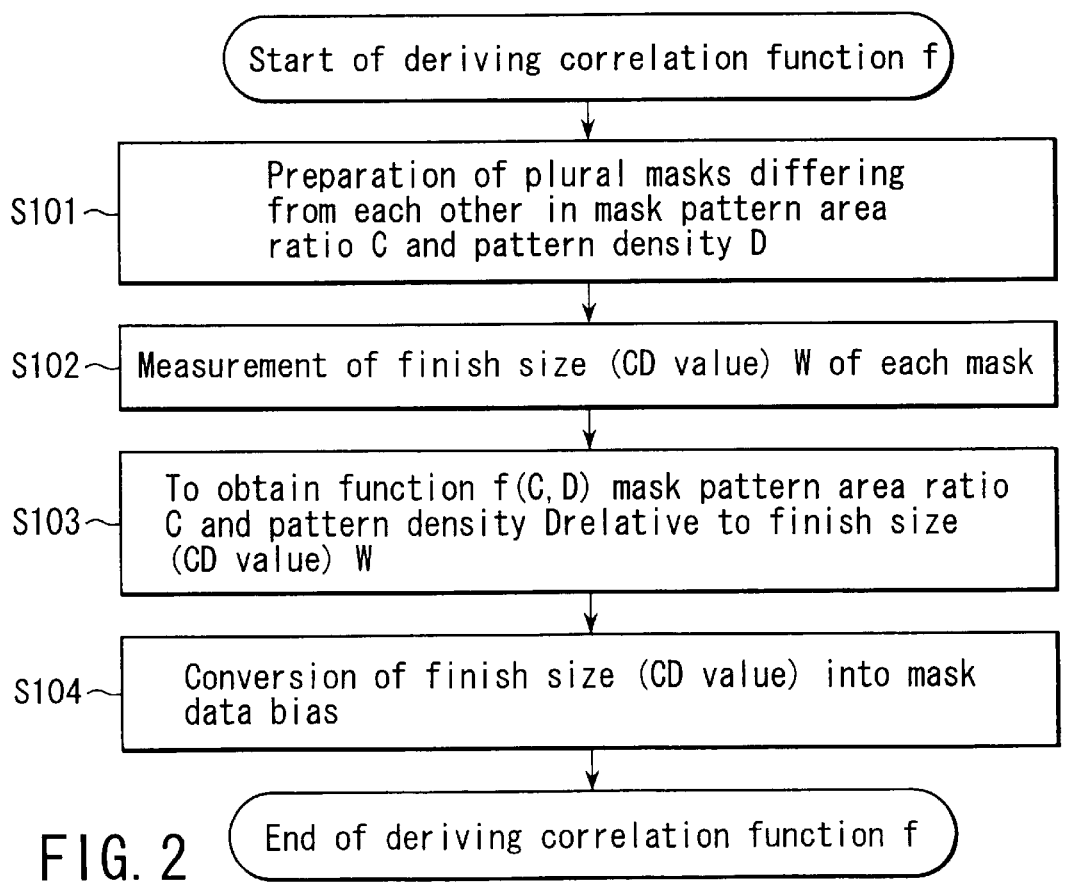
FIG. 2 is a flow chart showing how to derive a function according to the first embodiment of the present invention.

The method of deriving the correlation 104 required for the change of the photomask layout data will now be described with reference to FIG. 2, which is a flow chart showing how to derive the function relating to the first embodiment of the present invention.

The correlation 104 to be derived is a function giving an amount of data bias r=F(C, D), which is given to the photomask layout data, relative to the photomask pattern area ratio C and the pattern density D.

Incidentally, the finish size(CD value) W represents the difference between the pattern size on the photomask formed and processed on the basis of the layout data and the design size on the layout data. The photomask pattern area ratio C represents the ratio of the area of the light transmitting pattern portion (light shielding pattern portion) in the photomask to the area Am of the photomask. Further, the pattern density D represents the ratio of the area of the light transmitting pattern portion (light shielding pattern portion) to the area of the region extracted from the photomask.

(Step S101)

Figure 3A:
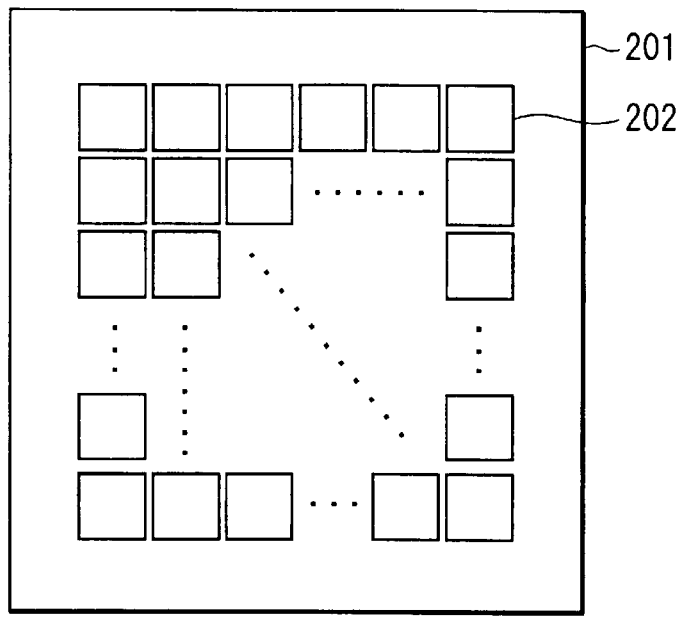
FIG. 3A is a plan view schematically showing the entire construction of a photomask for evaluation.
Figure 3B:
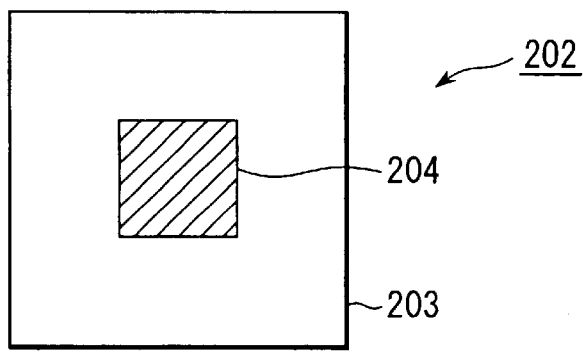
FIG. 3B is a plan view schematically showing the construction of a chip region formed in the photomask shown in FIG. 3A.
Figures 3C, 3D:
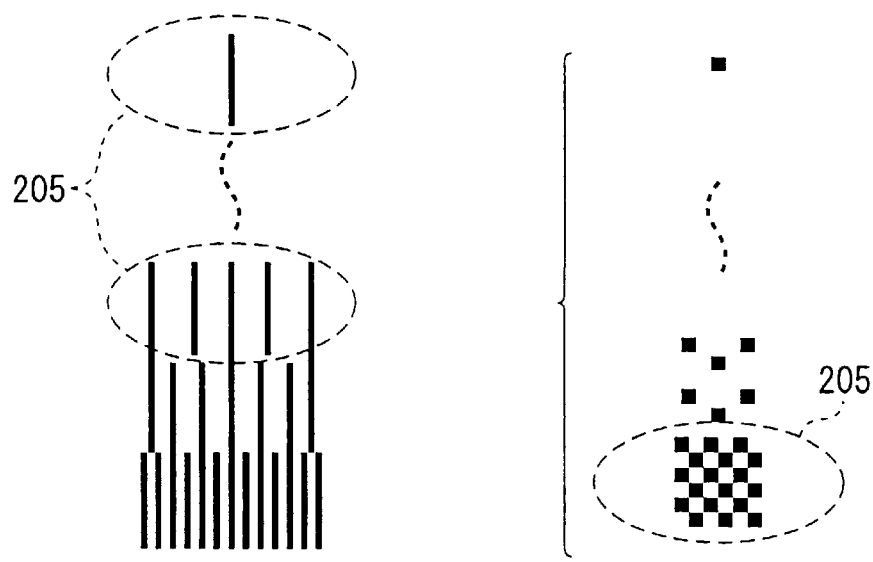
FIG. 3C is a plan view schematically showing a pattern for measuring the size formed in the chip region shown in FIG. 3B.
FIG. 3D is a plan view schematically showing a pattern for measuring the size formed in the chip region shown in FIG. 3B.

In the first step, manufactured are a plurality of photomasks for evaluation differing from each other in the pattern area ratio C, each having a plurality of pattern densities D, and having the same pattern arranged on each photomask. FIGS. 3A, 3B, 3C and 3D schematically show the construction of the photomask for evaluation. FIG. 3A is a plan view schematically showing the entire construction of the photomask for evaluation. FIG. 3B is a plan view schematically showing the chip region formed in the photomask shown in FIG. 3A. Further, FIGS. 3C and 3D are plan views each schematically showing the pattern for measuring the size, said pattern being formed in the chip region shown in FIG. 3B.

As shown in FIG. 3A, a plurality of chip regions 202 are arranged in a photomask 201 for evaluation. As shown in FIG. 3B, a size measuring pattern region 204 having a size measuring pattern formed therein is arranged in the central portion of each chip region 202, and an aperture rate change region 203 having a different aperture rate for each photomask is formed around the size measuring pattern region 204.

The size measuring pattern formed in the size measuring pattern region 204 is common with each chip forming region and each photomask 201 for evaluation. As shown in FIGS. 3C and 3D, size measuring patterns 205 are formed of patterns differing from each other in the pattern density depending on the regions. For example, a pattern density D of the wiring patterns is changed as shown in FIG. 3C. Alternatively, the pattern density of the holes is changed, as shown in FIG. 3D. The pattern density relative to regions $P_n$ (n representing the number of the extracted region) in which the pattern density is changed is represented by $D_n$.

In the aperture rate change region 203, the area of the light shielding film is changed for every photomask for evaluation. The planar pattern area ratio of each photomask can be changed by changing the aperture ratio of the aperture ratio change region.

(Step S102)

In the next step, the size measuring pattern formed in each photomask 201 for evaluation is measured, and the finish size (CD value) W, which is the shift amount relative to the design size value, is obtained from the measured value. It should be noted that the pattern size is measured in respect of the patterns of the regions differing from each other in pattern density.

(Step S103)

Figure 4:
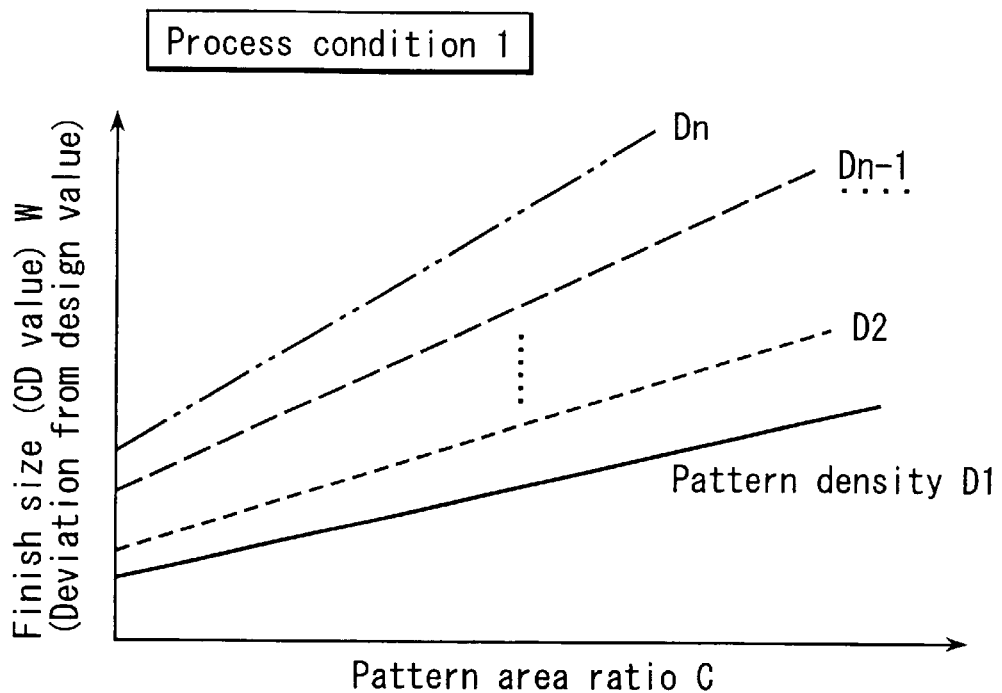
FIG. 4 is a graph showing the relationship among the pattern area ratio C, the pattern density D and the finish size W(CD value)
Figure 5:
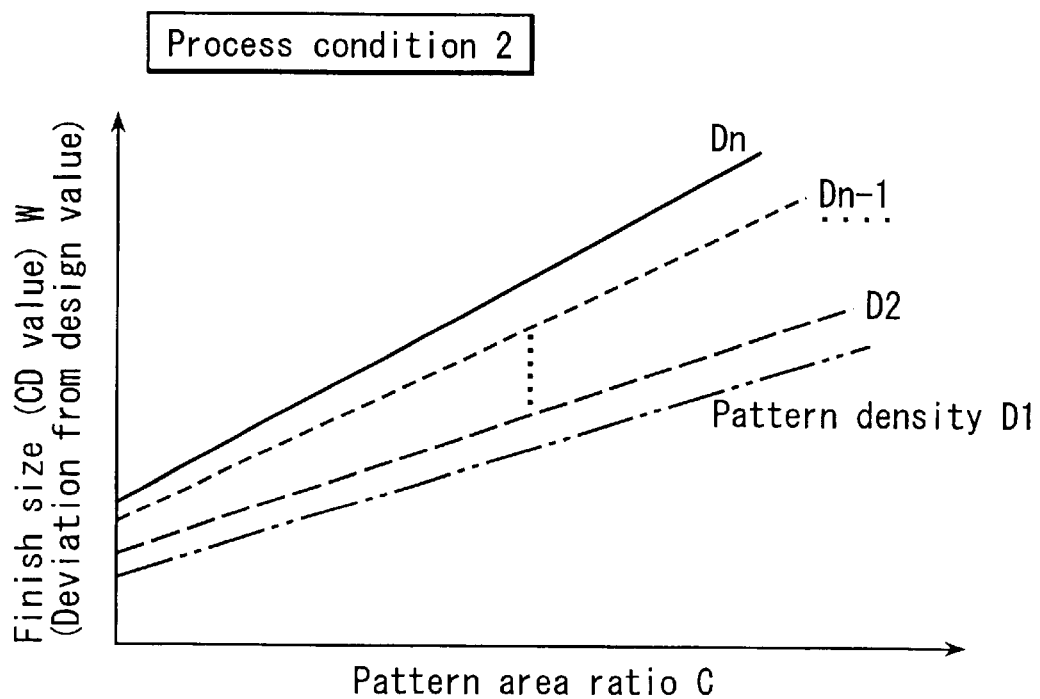
FIG. 5 is a graph showing the relationship among the pattern area ratio C, the pattern density D and the finish size W(CD value)

As a result of the measurement, obtained is the correlation between the pattern area ratio C, the pattern density D, and the finish size W as shown in FIGS. 4 and 5. The correlation thus obtained is represented by a function f(C, D). It should be noted that FIGS. 4 and 5 show the correlation obtained where the processing was performed under different conditions. Where a plurality of process conditions are employed as in this case, a photomask for evaluation is manufactured for each process condition so as to obtain each correlation function f.

(Step S104)

In the next step, a function r=F(C, D) giving a change amount r to the photomask layout data is obtained from the correlation function f(C, D) obtained in step S103. The finish size W, which represents the shift amount from the design size value, is used as the photomask data bias. In this embodiment, the photomask data bias r, which is equal to f(C, D)/2, is defined as the shift amount for the edge portion on one side. Incidentally, the photomask data bias r, which is due to the definition in synthesizing the pattern data, need not be ½.

Patterns of various densities are arranged in the region 204 in the layout pattern shown in FIG. 3. Therefore, in the case where the process conditions are made common by using the particular photomask, it is possible to obtain the function f common with the layout pattern having a difference in density such as the logic device and the memory-mixed device in addition to the memory device.

Figure 6:
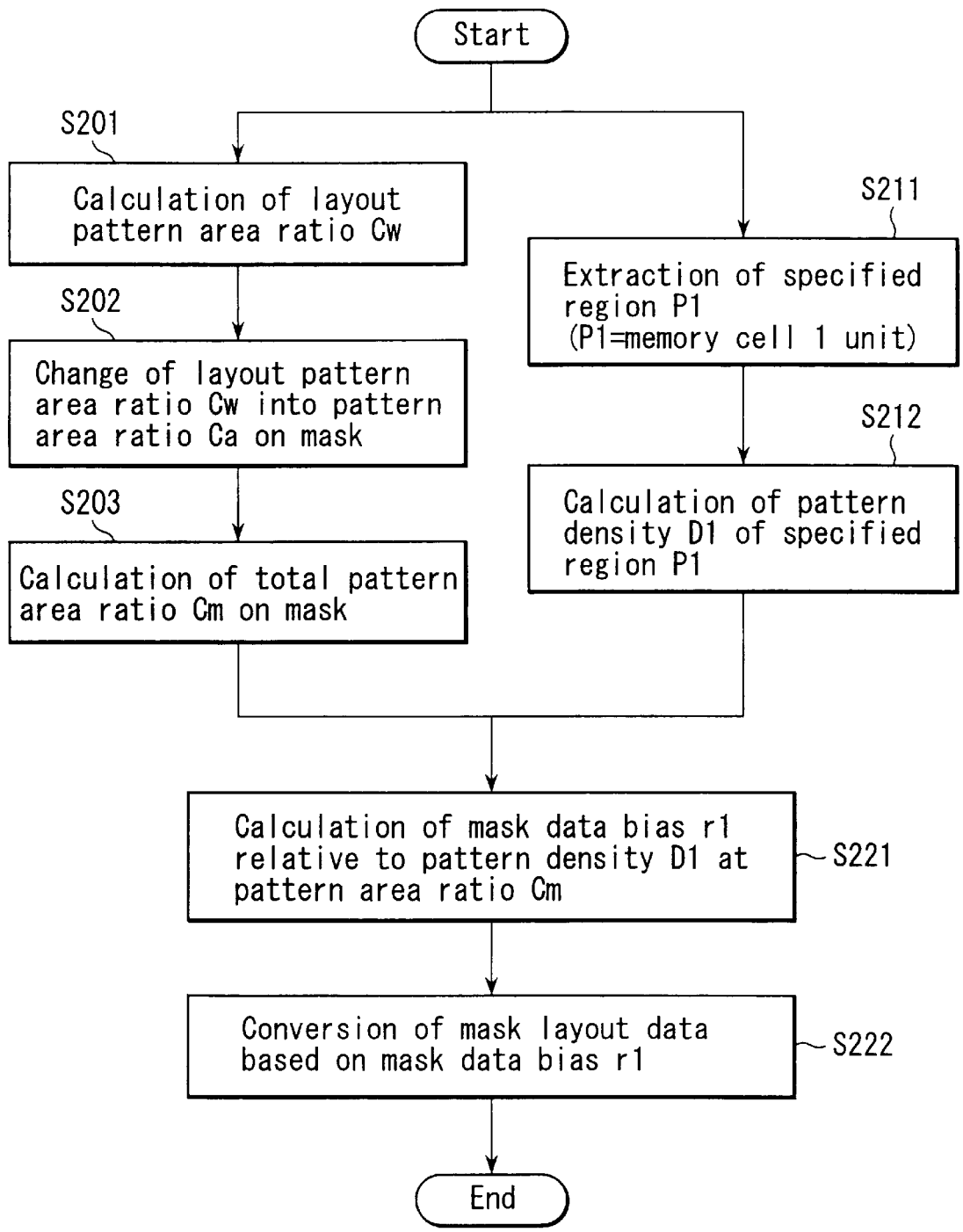
FIG. 6 is a flow chart showing the method of correcting the photomask layout pattern according to a first embodiment of the present invention.

The operation of the photomask layout data conversion system for converting a given layout on the basis of the data bias r=f(C, D) obtained previously so as to prepare a photomask data will now be described with reference to FIG. 6.

In the first step, the pattern area ratio Cm in the photomask plane in respect of the layout data 101 of the product photomask and the pattern density Dn within a specified region Pn, which has been extracted, are calculated in the data bias conversion parameter calculating section 102.

The measurement of the pattern area ratio C by the pattern area ratio calculating section 102a will now be described first.

(Step S201)

In the first step, the ratio of the open portion to the layout is calculated from the layout data 101, and ratio thus obtained is used as the layout pattern area ratio Cw.

(Step S202)

Then, the layout pattern area ratio Cw is converted into a pattern area ratio Ca on the photomask substrate on the basis of the chip area Aw and the photomask substrate area Am. It should be noted that the pattern area ratio Ca can be calculated from the layout pattern area ratio Cw, the chip area Aw and the photomask substrate area Am, as given below:

$$Ca=Cw \times Aw/Am$$

(Step S203)

In the next step, the pattern area ratio Cm on the photomask is obtained by adding the area ratio Cb of the various peripheral marks arranged on the photomask to the pattern area ratio Ca.

By the steps described above, it is possible for the pattern area ratio calculating section 102a to obtain the pattern area ratio Cm.

The measurement of the pattern density D performed by the pattern density calculating section 102b will now be described.

(Step S211)

In the first step, a region including a pattern requiring the highest dimensional accuracy among the layout is extracted as a specified region $P_n$. The size of the specified region $P_n$ is optional. However, it is necessary for the specified region $P_n$ to be sufficiently smaller than the chip area $A_w$, ($P_n << A_w$).

Since this embodiment is directed to a memory device having a uniform pattern density, the memory cell portion is extracted as the specified region. It should be noted that the number of extracted regions is 1, i.e., n=1, and $P_1$=memory cell portion. The size of the extracted region is set at a level not larger than one memory cell unit.

(Step S212)

Then, the pattern density $D_1$ in the specified region $P_1$ (aperture rate within $P_1$) is calculated.

By the steps described above, it is possible for the pattern density calculating section 102b to obtain the pattern density $D_1$.

Incidentally, it is possible for the pattern area ratio calculating section 102a to carry out the calculation of the pattern area ratio and for the pattern density calculating section 102b to carry out the calculation of the pattern density simultaneously or successively. Also, it is possible for any of the calculation of the pattern area ratio and the calculation of the pattern density to be carried out first.

The operation of the layout data conversion section 103 will now be described.

(Step S221)

In the first step, the photomask data bias r is obtained by substituting the pattern area ratio $C_m$ and the pattern density $D_1$ of the photomask obtained previously in the correlation 104 giving the photomask data bias r. Incidentally, the photomask data bias r is obtained as: $r=f(C_m, D_1)/2$.

(Step S222)

The photomask data bias r ($=(C_m, D_1)/2$) is given to the photomask layout data 101 by using the photomask data bias r thus obtained so as to output a converted photomask layout data 105. A new photomask layout data is formed by the steps described above.

Then, a photomask is prepared on the basis of the converted photomask layout data 105. It is possible for the photomask thus prepared to obtain a desired finish size.

Since the size of the data is corrected in advance in the photomask prepared by the method described above, it is unnecessary to adjust the dosage in the exposure step and the process conditions for every pattern so as to make it possible to ensure a process margin, to perform the treatment with a stable process, and to be low in fluctuation of the yield.

It should also be noted that, since it is unnecessary to determine simultaneously the individual conditions for many kinds of patterns, the number of process conditions is decreased so as to facilitate the process control. Also, it is possible to apply the same process conditions without sacrificing the process margin. As a result, it is possible to obtain a high yield with a high stability in the manufacture of the photomask.

Figure 7:
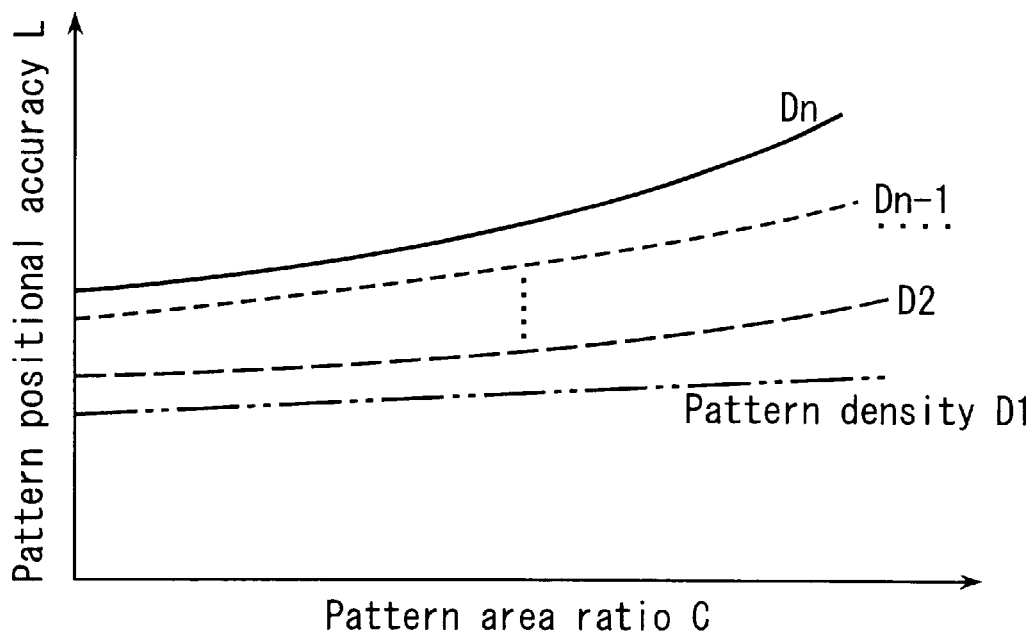
FIG. 7 is a graph showing the relationship among the pattern area ratio C, the pattern density D and the positional accuracy L.
Figure 8:
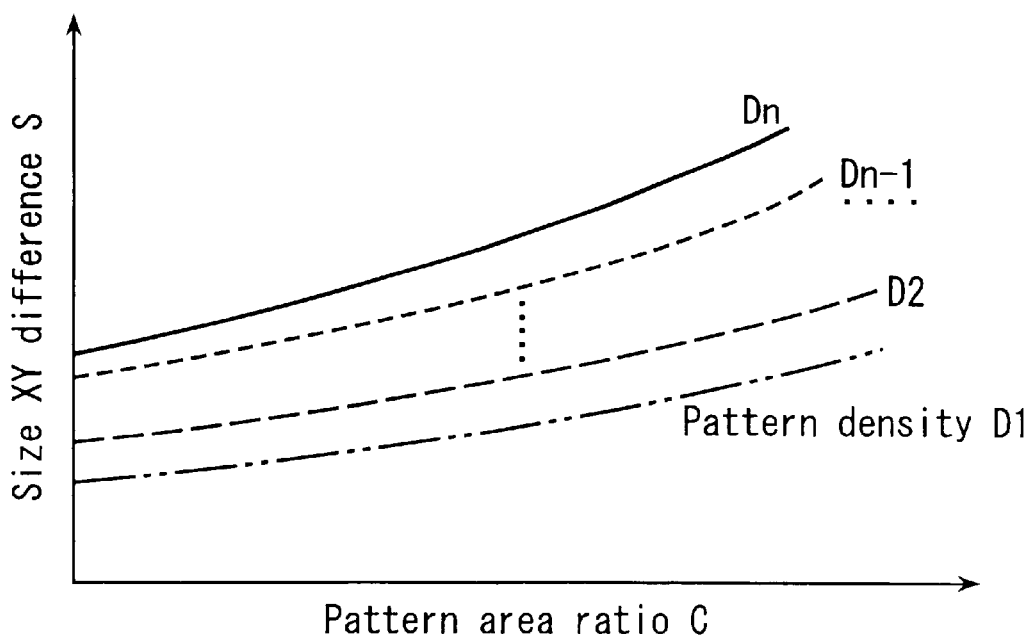
FIG. 8 is a graph of a function h (c, d) showing the relationship among the pattern area ratio C, the pattern density D and the XY difference S of the positional accuracy L.

Further, in the first embodiment of the present invention, used was a function of the finish size with the pattern area ratio and the pattern density used as parameters. However, it is also possible to obtain a desired position accuracy or a desired XY difference accuracy by the method equal to that for the size described above by using a function of the positional accuracy L, (L=g (c, d)), with the pattern area ratio and the pattern density used as parameters, as shown in FIG. 7, or a function of the XY difference S (S=h (c, d)), with the pattern area ratio and the pattern density used as parameters, as shown in FIG. 8.

(Second Embodiment)

The second embodiment of the present invention is directed to a method of manufacturing a photomask pattern for kinds of memory-mixed logic device which have a plurality of unit devices differing from each other in pattern density.

Figure 9:
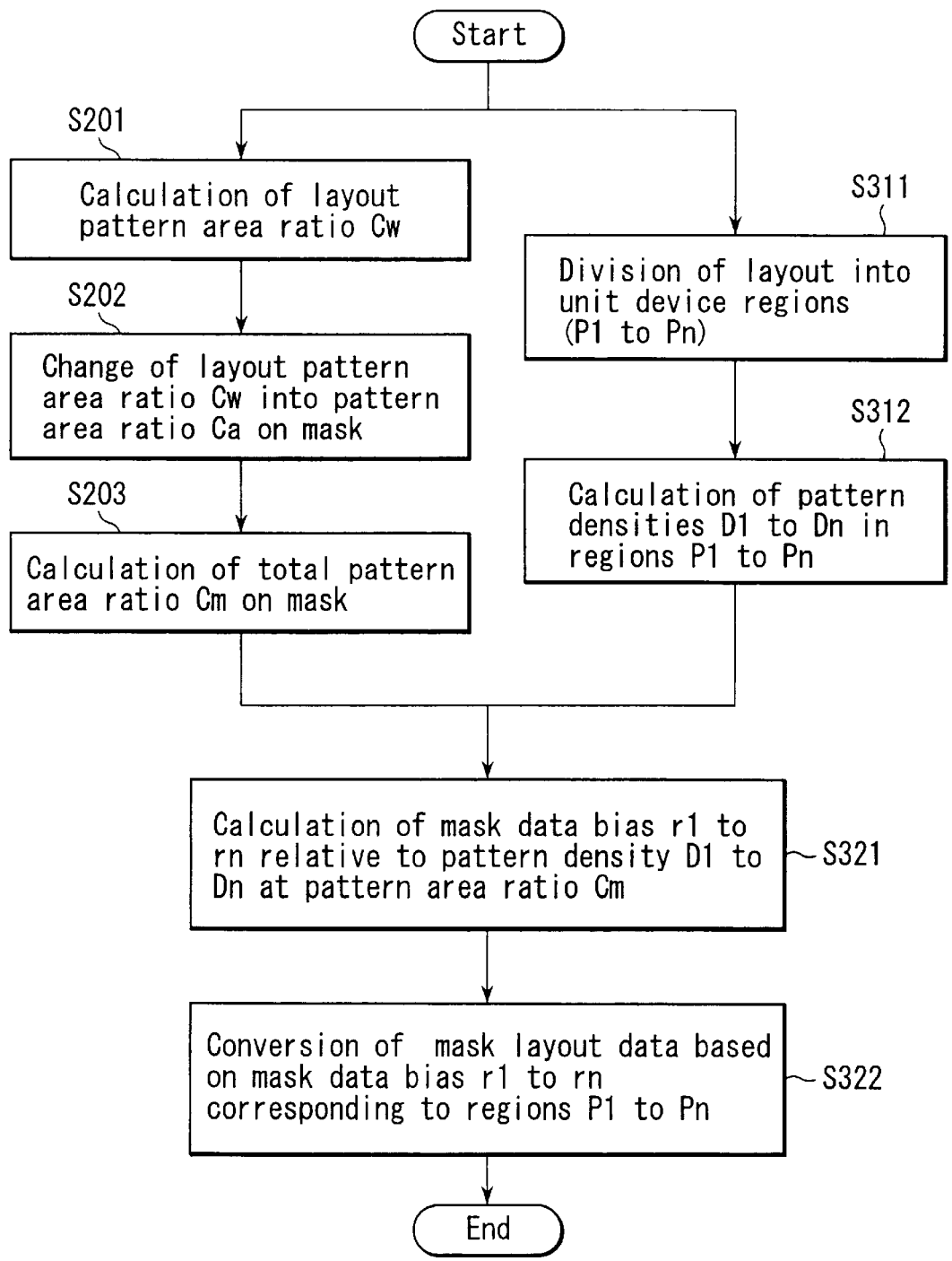
FIG. 9 is a flow chart showing the method of correcting the photomask layout pattern according to a second embodiment of the present invention.

FIG. 9 is a flow chart showing the conversion method of a photomask layout data according to the second embodiment of the present invention.

The correlation function f in the second embodiment is derived as in the first embodiment described previously with reference to FIG. 2 and, thus, the description is omitted with respect to the steps of deriving the correlation function f in the second embodiment. Also, the steps S201 to S203 for calculating the pattern area ratio Cm shown in FIG. 9 are equal to those for the first embodiment and, thus, the description of these steps S201 to S203 is omitted.

(Step S311)

In the pattern density calculating section 102b, the photomask layout data 101 is divided into blocks for unit devices so as to obtain specified regions $P_1$ to $P_n$.

(Step S312)

Then, the pattern densities $D_1$ to $D_n$ for the specified regions $P_1$ to $P_n$ are calculated.

(Step 321)

In the next step, the pattern densities $D_1$ to $D_n$ and the pattern area ratio Cm are substituted in the correlation 104 in the pattern data change section so as to obtain photomask data bias $r_1$ to $r_n$ in the specified regions $P_1$ to $P_n$.

Incidentally, the photomask data bias $r_1$ to $r_n$ in the specified regions $P_1$ to $P_n$ are as follows:

$r_1=f(Cm, D_1)/2,$ $r_2=f(Cm, D_2)/2, \ldots,$ $r_n=f(Cm, D_n)/2$ (Step S322)

Then, the corresponding unit device unit $P_i$ (i=1 to n) is inputted to the photomask data bias $r_1$ to $r_n$ so as to synthesize again pattern data, and a photomask is prepared by using the data after the synthesis. It follows that it is possible to obtain a desired finish size on a photomask in respect of a memory-mixed logic device in which a plurality of unit devices differing from each other in the pattern density are laid out in a plane.

Incidentally, it is possible to apply the method according to the second embodiment of the present invention to not only a mixed logic device but also to a photomask pattern, which has a similar layout pattern and which can be divided into blocks depending on the pattern density.

It should be noted that, since the size of the data is corrected in advance in the photomask prepared by the method described above, it is unnecessary to adjust the dose in the light exposure step and the process conditions for every pattern so as to make it possible to ensure a process margin, to perform the treatment with a stable process, and to be low in fluctuation of the yield.

Further, it is possible to obtain a desired positional accuracy or a desired XY difference accuracy with a high yield by applying the method of the second embodiment to the correction of the positional accuracy or the XY difference accuracy as in the first embodiment of the present invention described previously.

(Third Embodiment)

The third embodiment of the present invention is directed to a method of preparing a photomask pattern for a logic device in which the pattern density in a plane is not uniform and the layout pattern cannot be divided easily.

Figure 10:
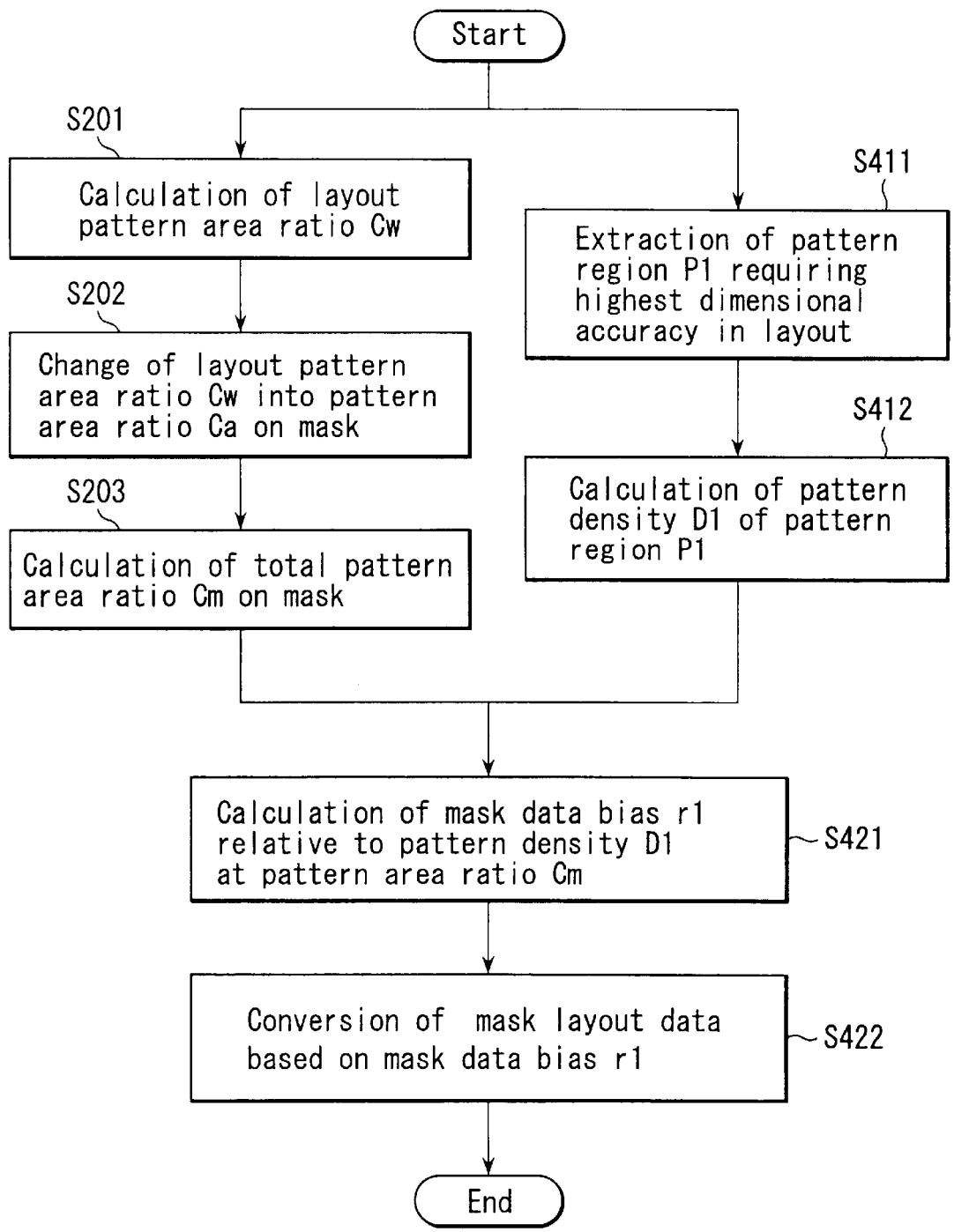
FIG. 10 is a flow chart showing the method of correcting the photomask layout pattern according to a third embodiment of the present invention.

FIG. 10 is a flow chart showing the change method of a photomask layout data according to the third embodiment of the present invention.

The correlation function f in the third embodiment is derived as in the first embodiment described previously with reference to FIG. 2 and, thus, the description is omitted with respect to the steps of deriving the correlation function f in the third embodiment. Also, the steps S201 to S203 for calculating the pattern area ratio Cm shown in FIG. 10 are equal to those for the first embodiment and, thus, the description of these steps S201 to S203 is omitted.

In calculating the pattern density $D_n$ of the specified region, a pattern requiring the highest dimensional accuracy within the photomask is extracted in respect of the layout pattern, and the region within 100 μm from the extracted pattern constitutes a region $P_1$. Then, the pattern density D1 in the region $P_1$ is calculated.

In the next step, the data bias $r_1$, ($r_1$=f (Cm, D1)), is obtained by substituting the pattern density D1 and the pattern area ratio Cm in the correlation function r in the pattern data conversion section.

The photomask data bias $r_1$ thus obtained is inputted so as to synthesize again pattern data, and a photomask is prepared by using the data after the synthesis. In this fashion, it is possible to obtain a desired finish size in respect of the logic device pattern in which the pattern density in a photomask plane is not uniform.

Incidentally, in the third embodiment described above, a single pattern requiring the highest dimensional accuracy within the mask was extracted so as to provide the region $P_1$. Alternatively, it is also possible to extract a plurality of patterns within the layout and to calculate the pattern density of the peripheral region within 100 µm from the extracted pattern. In this case, the average value of the pattern densities of the peripheral regions is used as the pattern density D1. Also, the size of the peripheral region is set at 100 µm in the third embodiment described above. However, the size noted above need not be limited to 100 µm.

Also, the application of the method according to the third embodiment of the present invention is not limited to a logic device, and the method according to the third embodiment of the present invention can be applied to various layout patterns. Further, the third embodiment of the present invention is advantageous in that, since the data bias is unique for each layout pattern, the pattern data can be synthesized again easily.

It should also be noted that the method according to the third embodiment of the present invention makes it possible to obtain a desired positional accuracy or a desired XY difference accuracy with a high yield by the application of the particular method to the correction of the positional accuracy or the XY difference accuracy, like the methods according to the first and second embodiments described above.

Incidentally, the present invention is not limited to the embodiments described above. In other words, the present invention can be worked in variously modified fashions within the technical scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for correcting a design data of a layout pattern of a photomask in which are arranged a light transmitting pattern portion and a light shielding pattern portion for forming an optical image pattern on the surface of a substrate, comprising:

calculating a pattern area ratio, which is a ratio of the light transmitting pattern portion or the light shielding pattern portion to an area of the photomask from the design data of a given layout pattern of the photomask, and a pattern density, which is a ratio of said light transmitting pattern portion or light shielding pattern portion within said region to the area of the region extracted from the given layout pattern;

estimating from the calculated pattern area ratio and the pattern density the size of a pattern formed in the case where the pattern is formed on the photomask by using the design data of the given layout pattern; and imparting the amount of correction to the design data of the given layout pattern based on the estimated pattern size.

2. The method for correcting a design data of a layout pattern of a photomask according to claim 1, wherein the region extracted from said layout pattern is a region including a pattern requiring the highest dimensional accuracy among the layout pattern.

3. The method for correcting a design data of a layout pattern of a photomask according to claim 1, wherein the estimation of said pattern size is performed by using any of:

a first function representing the relationship between said pattern area ratio and the pattern size obtained by actually processing the photomask;

a second function representing the relationship between said pattern density and the pattern size obtained by actually processing the photomask; and a third function representing the relationship between said pattern area ratio, said pattern density, and the pattern size obtained by actually processing the photomask.

4. The method for correcting a design data of a layout pattern of a photomask according to claim 3, wherein said second function and said third function are obtained by measuring the pattern sizes of photomasks for evaluation processed by using a plurality of pattern data having patterns for the size measurement having a plurality of pattern densities arranged therein and differing from each other in the pattern area ratio.

5. A method for correcting a design data of a layout pattern of a photomask in which a light transmitting pattern portion and a light shielding pattern portion are formed for forming a predetermined optical image pattern on the surface of a substrate, comprising:

calculating a pattern area ratio, which is a ratio of the area of the light transmitting pattern portion or the light shielding pattern portion to the area of a photomask, and a pattern density, which is a ratio of the area of said light transmitting pattern portion or the light shielding pattern portion within said region to the area of the region extracted from the given layout pattern based on a given design data of the layout pattern of the photomask;

estimating the positional accuracy of the formed pattern from the calculated pattern area ratio and the pattern density, covering the case where a pattern is formed in the photomask by using a given design data of the layout pattern; and imparting a correction amount to the amount of the given layout pattern based on the estimated positional accuracy.

* * * * *